United States Patent
Sakamoto et al.

(10) Patent No.: US 8,334,176 B2
(45) Date of Patent: Dec. 18, 2012

(54) METHOD OF MANUFACTURING SEMICONDUCTOR DEVICE

(75) Inventors: Ken Sakamoto, Tokyo (JP); Taketoshi Shikano, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/220,999

(22) Filed: Aug. 30, 2011

(65) Prior Publication Data

US 2012/0088337 A1 Apr. 12, 2012

(30) Foreign Application Priority Data

Oct. 6, 2010 (JP) ................................. 2010-226608

(51) Int. Cl.
*H01L 21/44* (2006.01)
*H01L 21/48* (2006.01)
(52) U.S. Cl. ................. 438/127; 438/123; 257/E21.502
(58) Field of Classification Search .................. 438/123, 438/127
See application file for complete search history.

(56) References Cited

U.S. PATENT DOCUMENTS

| | | | | |
|---|---|---|---|---|
| 5,853,771 A * | 12/1998 | Matsumoto | ..................... | 425/116 |
| 5,885,852 A * | 3/1999 | Kishikawa et al. | ............ | 438/117 |
| 6,780,679 B2 * | 8/2004 | Ito et al. | ......................... | 438/123 |
| 6,955,941 B2 * | 10/2005 | Bolken | ......................... | 438/106 |
| 8,105,883 B2 * | 1/2012 | Yoshiba et al. | ............... | 438/127 |
| 2006/0240600 A1 * | 10/2006 | Ito et al. | ......................... | 438/123 |
| 2007/0111395 A1 * | 5/2007 | Tsai et al. | ...................... | 438/123 |
| 2009/0127681 A1 * | 5/2009 | Son et al. | ......................... | 257/675 |
| 2010/0164082 A1 * | 7/2010 | Fujisawa | ......................... | 257/680 |
| 2011/0175217 A1 * | 7/2011 | Jaunay et al. | .................. | 257/692 |

FOREIGN PATENT DOCUMENTS

| | | |
|---|---|---|
| JP | 5-185467 | 7/1993 |
| JP | 6-244228 | 9/1994 |
| JP | 7-130780 | 5/1995 |
| JP | 8-156009 | 6/1996 |
| JP | 8-323798 | 12/1996 |
| JP | 11-121656 | 4/1999 |
| JP | 2008-166395 | 7/2008 |

OTHER PUBLICATIONS

Office Action issued Jun. 6, 2012, in German Patent Appln. No. 10 2011 084 058.3, filed Oct. 5, 2011, (w/English translation).

* cited by examiner

*Primary Examiner* — Alexander Ghyka
(74) *Attorney, Agent, or Firm* — Oblon, Spivak, McClelland, Maier & Neustadt, L.L.P.

(57) ABSTRACT

A method of manufacturing a semiconductor device, includes the steps of mounting a lead frame in a recessed portion of a lower die, bringing the lower die and an upper die to overlap each other so that a portion for sliding the lead frame slides the lead frame toward injection surfaces, the sliding portion being formed on the recessed portion of the lower die or on the recessed portion of the upper die, clamping the lower die and the upper die together so that at least one projection formed on the upper die crushes down an end portion of the lead frame so as to form lateral projections on the left and right sides of the gate, the lateral projections blocking up the gap between the injection surfaces and the lead frame, and injecting a molding resin through the gate.

8 Claims, 7 Drawing Sheets

METHOD OF MANUFACTURING SEMICONDUCTOR DEVICE

BACKGROUND OF THE INVENTION

1. Field of the Invention

The present invention relates to a method of manufacturing a semiconductor device, which includes encapsulating the lead frame in a molding die with a resin.

2. Background Art

Japanese Laid-Open Patent Publication No. H05-185467 discloses a technique for mounting a lead frame in a recessed portion of a molding die and encapsulating the lead frame with a resin. This technique crushes down portions of the periphery of the lead frame to form lateral projections. These lateral projections block up the gap (hereinafter referred to as the clearance) between the lead frame and the side surface of the recessed portion of the molding die at which the gate opens. When a molding resin is injected through the gate after forming the lateral projections, the molding resin is blocked by these lateral projections. This prevents attachment of the molding resin to the terminals of the lead frame.

It has been found, however, that if the lateral projections are formed when the clearance is large, they may not be able to reach the facing side surface of the recessed portion and hence may not able to block up the clearance. In order to prevent this from happening, the recessed portion may be narrowed so as to reduce the size of the clearance beforehand. However, this has resulted in an inability to accommodate variations (manufacturing variations) in the size of the lead frame, and some larger lead frames have been accidentally pinched between the upper and lower dies.

SUMMARY OF THE INVENTION

The present invention has been made to solve the above problems. It is, therefore, an object of the present invention to provide a method of manufacturing a semiconductor device, which prevents the lead frame from being accidentally pinched between the upper and lower dies, as well as preventing attachment of the molding resin to the terminals of the lead frame.

According to one aspect of the present invention, a method of manufacturing a semiconductor device, includes the steps of mounting a lead frame in a recessed portion of a lower die, bringing the lower die and an upper die to overlap each other so that means for sliding the lead frame slides the lead frame toward injection surfaces, one of which is the side surface of the recessed portion of the lower die at which a gate opens and the other of which is the side surface of a recessed portion of the upper die at which the gate opens, the sliding means being formed on the recessed portion of the lower die or on the recessed portion of the upper die, clamping the lower die and the upper die together so that at least one projection formed on the upper die crushes down an end portion of the lead frame so as to form lateral projections on the left and right sides of the gate, the lateral projections blocking up the gap between the injection surfaces and the lead frame, and injecting a molding resin through the gate.

Other and further objects, features and advantages of the invention will appear more fully from the following description.

DETAILED DESCRIPTION OF THE PREFERRED EMBODIMENTS

First Embodiment

Figure 1:
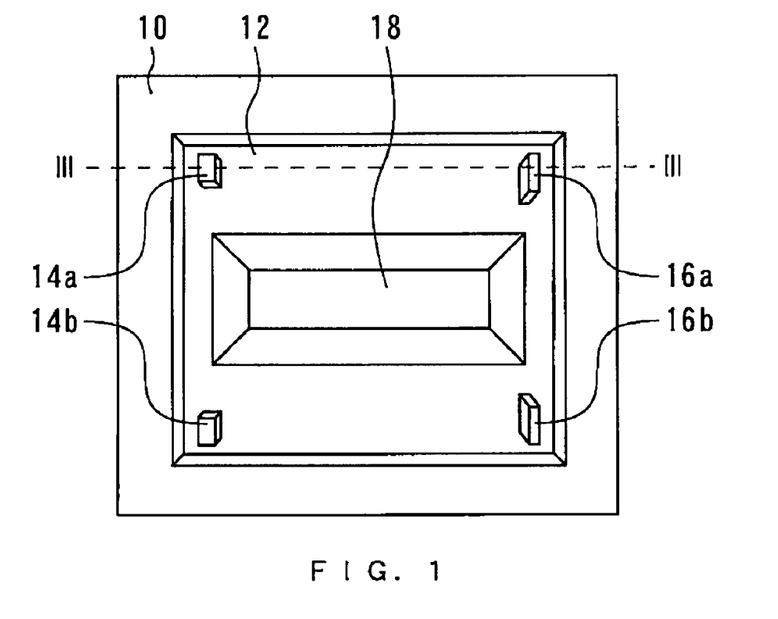
FIG. 1 is a plan view of an upper die used by a method of manufacturing a semiconductor device in accordance with a first embodiment of the present invention.

FIG. 1 is a plan view of an upper die 10 used by a method of manufacturing a semiconductor device in accordance with a first embodiment of the present invention. The upper die 10 has formed therein a recessed portion 12 recessed relative to the periphery portion of the upper die. Projections 14a and 14b and slide projections 16a and 16b are formed on the recessed portion 12. The slide projections 16a and 16b are longer than the projections 14a and 14b. The recessed portion 12 has formed at its central portion a cavity 18 recessed relative to the other portion of the recessed portion 12.

Figure 2:
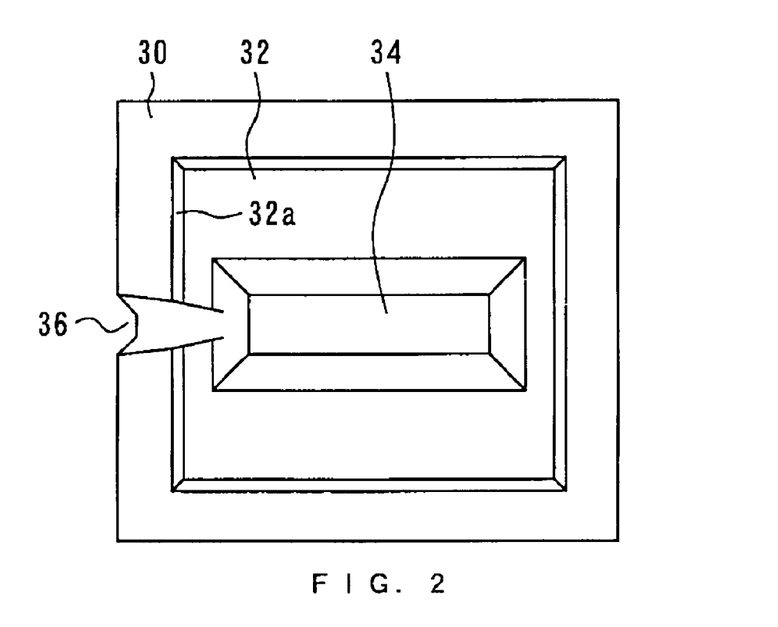
FIG. 2 is a plan view of a lower die used by the method of manufacturing a semiconductor device in accordance with the first embodiment.

FIG. 2 is a plan view of a lower die 30 used by the method of manufacturing a semiconductor device in accordance with the first embodiment. The lower die 30 has formed therein a recessed portion 32 recessed relative to the periphery portion of the lower die. The recessed portion 32 has formed at its central portion a cavity 34 recessed relative to the other portion of the recessed portion 32. A gate 36 opens at a side surface of the recessed portion 32, and serves as a path for injecting a molding resin into the cavities 18 and 34. The side surface of the recessed portion 32 at which the gate 36 opens is referred to as the "injection surface 32a."

Figure 3:
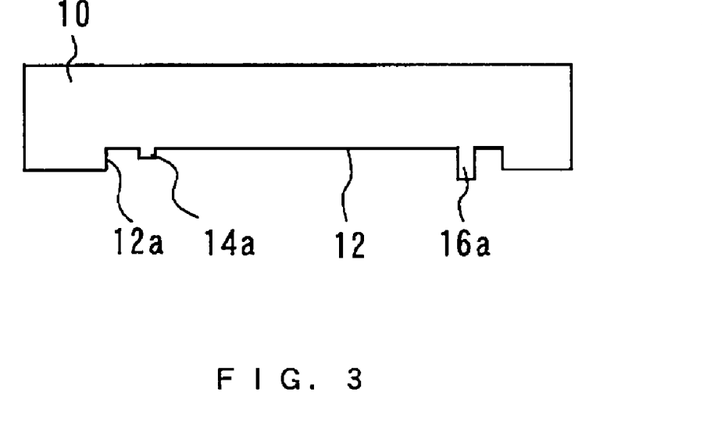
FIG. 3 is a cross-sectional view taken along dashed line III-III of FIG. 1.

FIG. 3 is a cross-sectional view taken along dashed line of FIG. 1. Since the side surface of the recessed portion 12 adjacent to and facing the projection 14a (as viewed in FIG. 3) forms a single plane with the injection surface 32a of the lower die 30 when the upper and lower dies 10 and 30 are clamped together, this side surface of the recessed portion 12 is referred to as the "injection surface 12a."

Figure 4:
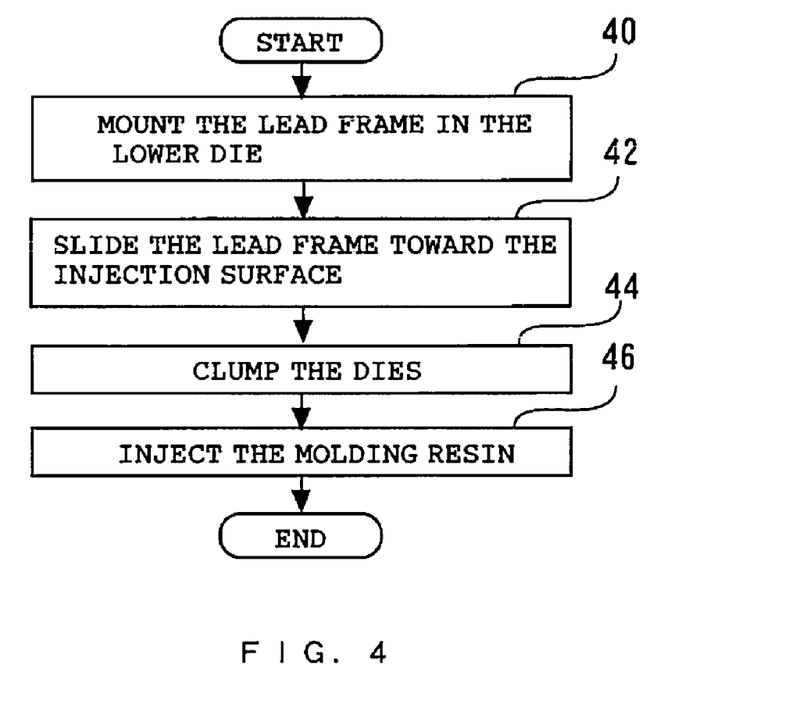
FIG. 4 is a flowchart showing the method of manufacturing a semiconductor device in accordance with the first embodiment.
Figure 5:
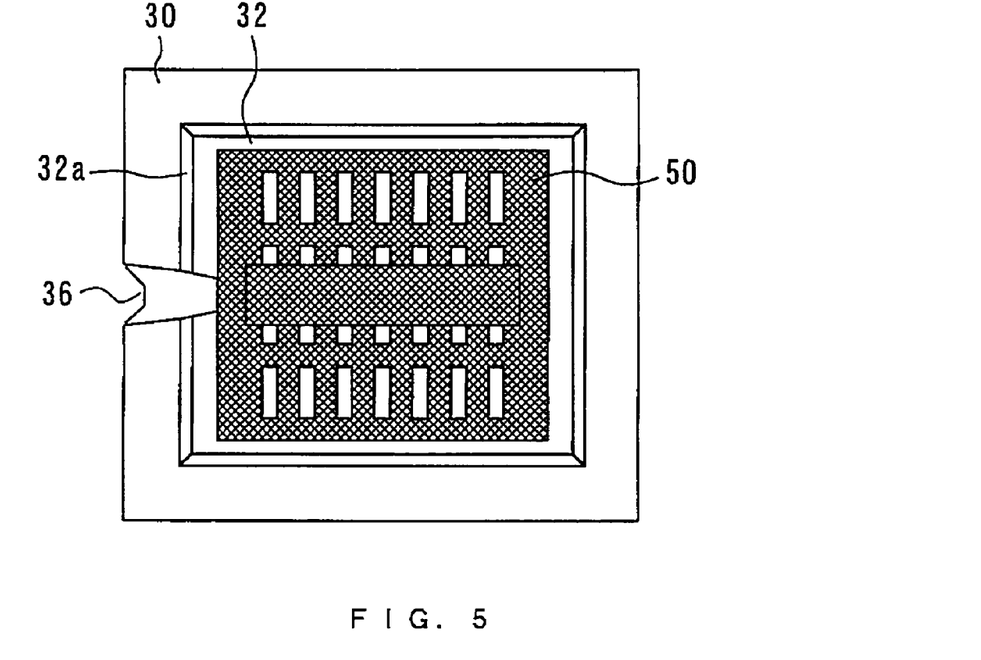
FIG. 5 is a diagram showing the lead frame mounted in the recessed portion of the lower die.

FIG. 4 is a flowchart showing the method of manufacturing a semiconductor device in accordance with the first embodiment. The method of manufacturing a semiconductor device in accordance with the first embodiment will be described with reference to this flowchart. First, a lead frame 50 is mounted in the recessed portion 32 of the lower die 30 in Step 40. This step will be described with reference to FIG. 5. FIG. 5 is a diagram showing the lead frame 50 mounted in the recessed portion 32 of the lower die 30.

Since, in general, the dimensions of lead frames vary to some extent due to manufacturing variations, the recessed portion 32 is formed to have dimensions a little larger than the design dimensions of the lead frame 50, thus providing a margin of safety. Therefore, there is a gap (or clearance) between the injection surface 32a and the lead frame 50.

Figure 6:
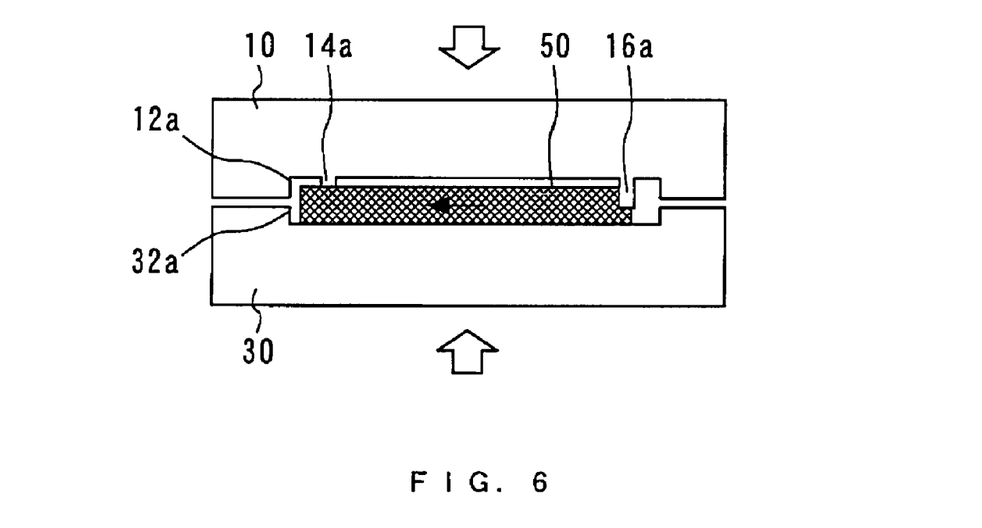
FIG. 6 is a diagram showing the way in which the upper and lower dies and are brought to overlap each other (or brought into close alignment with each other) so as to slide the lead frame toward the injection surface.

The processing then proceeds to Step 42. In Step 42, the lead frame 50 is caused to slide toward the injection surface 32a. This step will be described with reference to FIG. 6. FIG. 6 is a diagram showing the way in which the upper and lower dies 10 and 30 are brought to overlap each other (or brought into close alignment with each other) so as to slide the lead frame toward the injection surface 32a. In Step 42, the upper and lower dies 10 and 30 are brought to overlap each other so that only a portion of the leading edge of the slide projection 16a is in contact with the end portion of the lead frame 50 opposite that facing the injection surfaces 12a and 32a. (The end portion of the lead frame 50 opposite that facing the injection surfaces 12a and 32a is hereinafter referred to as the "first end portion" of the lead frame 50.)

The upper and lower dies 10 and 30 are then brought further toward each other, as indicated by the white arrows in FIG. 6, so that the slide projection 16a crushes down the first end portion of the lead frame 50. Further, since the first end portion of the lead frame 50 is crushed down, the lead frame 50 slides toward the injection surfaces 12a and 32a. The direction in which the lead frame 50 slides is indicated by the black arrow in FIG. 6. The clearance between the lead frame 50 and the injection surfaces 12a and 32a after the completion of Step 42 is smaller than that before Step 42. It should be noted that the slide projection 16b functions in the same manner as the slide projection 16a.

The processing then proceeds to Step 44. In Step 44, the dies are clamped together to eliminate the clearance. Specifically, in the die clamping, the upper and lower dies 10 and 30 are brought into contact with each other so that a molding resin can be injected into the cavities. In Step 44, the entire leading edge of the projection 14a is brought into contact with the end portion of the lead frame 50 opposite the first end portion thereof. (The end portion of the lead frame 50 opposite the first end portion is hereinafter referred to as the "second end portion" of the lead frame 50.)

Figure 7:
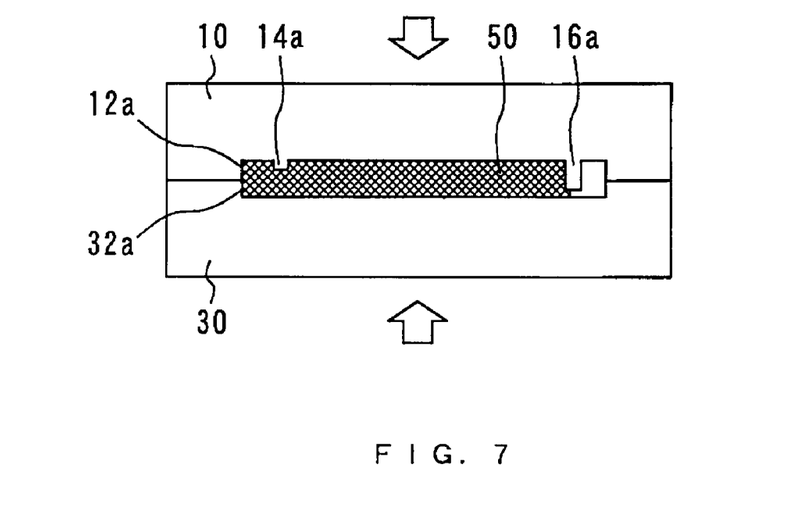
FIG. 7 shows the way in which the clearance is blocked up by the formed lateral projection of the second end portion of the lead frame as a result of the completion of the die clamping.

The upper and lower dies 10 and 30 are then further clamped together, as indicated by the white arrows in FIG. 7, so that the second end portion of the lead frame 50 is crushed down and, as a result, a portion of this end portion projects laterally toward the injection surfaces 12a and 32a, thereby blocking up the clearance. FIG. 7 shows the way in which the clearance is blocked up by the formed lateral projection of the second end portion of the lead frame 50 as a result of the completion of the die clamping. It should be noted that the projection 14b functions in the same manner as the projection 14a.

Figure 8:
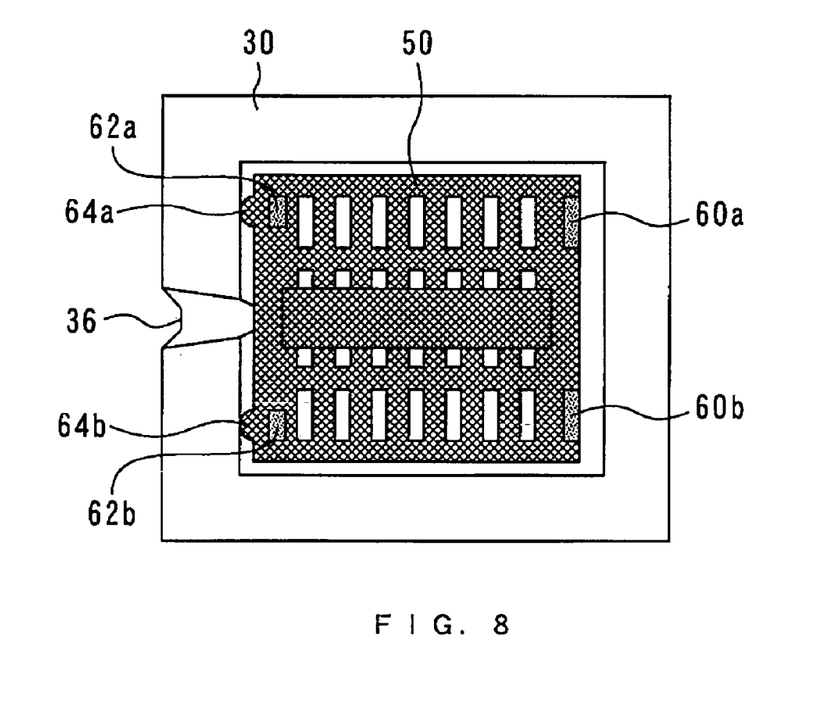
FIG. 8 is a plan view showing the lead frame in the lower die shown in FIG. 7.

FIG. 8 is a plan view showing the lead frame 50 in the lower die 30 shown in FIG. 7. As shown, the first end portion of the lead frame 50 has been crushed down by the slide projections 16a and 16b so that recessed portions 60a and 60b are formed in the first end portion. Further, the second end portion of the lead frame 50 has been crushed down by the projections 14a and 14b so that recessed portions 62a and 62b are formed in the second end portion. Further, due to the formation of the recessed portions 62a and 62b, lateral projections 64a and 64b are formed on the left and right sides (or opposite sides) of the gate 36 so as to block up the clearance.

Figure 9:
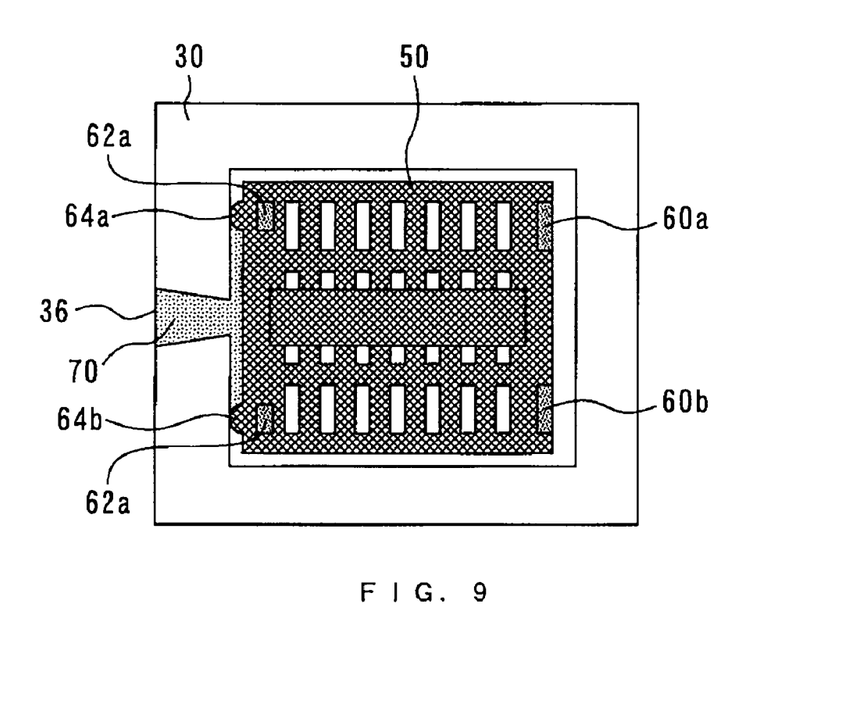
FIG. 9 is a diagram showing the way in which the lateral projections block the molding resin.

The processing then proceeds to Step 46. In Step 46, a molding resin 70 is injected through the gate 36. This step will be described with reference to FIG. 9. FIG. 9 is a diagram showing the way in which the lateral projections 64a and 64b block the molding resin 70. In Step 46, the molding resin 70 is injected into the cavities 18 and 34 by a transfer molding technique, and then a dwelling process, etc. is carried out to form a package. The lateral projections 64a and 64b prevent the flow of molding resin 70 from extending along the periphery of the lead frame 50, as shown in FIG. 9.

In the semiconductor device manufacturing method of the first embodiment, the projections 64a and 64b are formed before the injection of the molding resin in Step 46, so as to block up the clearance (between the injection surface 32a and the lead frame 50) on the left and right sides of the gate 36. Thus, the molding resin 70 is injected after the clearance is blocked up by the lateral projections 64a and 64b, making it possible to prevent the mold resin 70 from being attached extensively to the terminals of the lead frame 50.

It should be noted that, in accordance with the first embodiment, the lead frame 50 is caused to slide toward the injection surface 32a in Step 42, thereby sufficiently reducing the clearance, before forming the lateral projections 64a and 64b. This allows the clearance to be reliably blocked up by the lateral projections 64a and 64b when these projections are formed in the following step.

In accordance with the semiconductor device manufacturing method of the first embodiment, the clearance between the injection surface 32a and the lead frame 50 before executing the sliding step (Step 42) need not be small, since in Step 42 the lead frame is caused to slide so as to reduce the clearance. Therefore, the recessed portion 32 can be made wide enough to accommodate manufacturing variations in the size of the lead frame 50. Thus, it is possible to prevent the lead frame from being accidentally pinched between the upper and lower dies.

Although the semiconductor device manufacturing method of the first embodiment crushes down the first and second end portions of the lead frame, it is to be understood that the present invention is not limited to this. Specifically, the method of the present invention includes the step of sliding the lead frame to a predetermined position, providing high controllability of the position of the lead frame. That is, the lead frame can be set at the desired position.

The high controllability of the position of the lead frame allows lateral projections to be formed, e.g., on the tie bars of the lead frame, which are much smaller than the first and second end portions of the lead frame. Specifically, the tie bars may be pushed and crushed by some projections so as to form lateral projections to block up the gap between the tie bars and the upper and lower dies. In this case, the upper die may have tie bar-crushing projections for crushing down a portion of a tie bar, and the tie bars may be crushed down by these projections in the lateral projection forming step.

Figure 10:
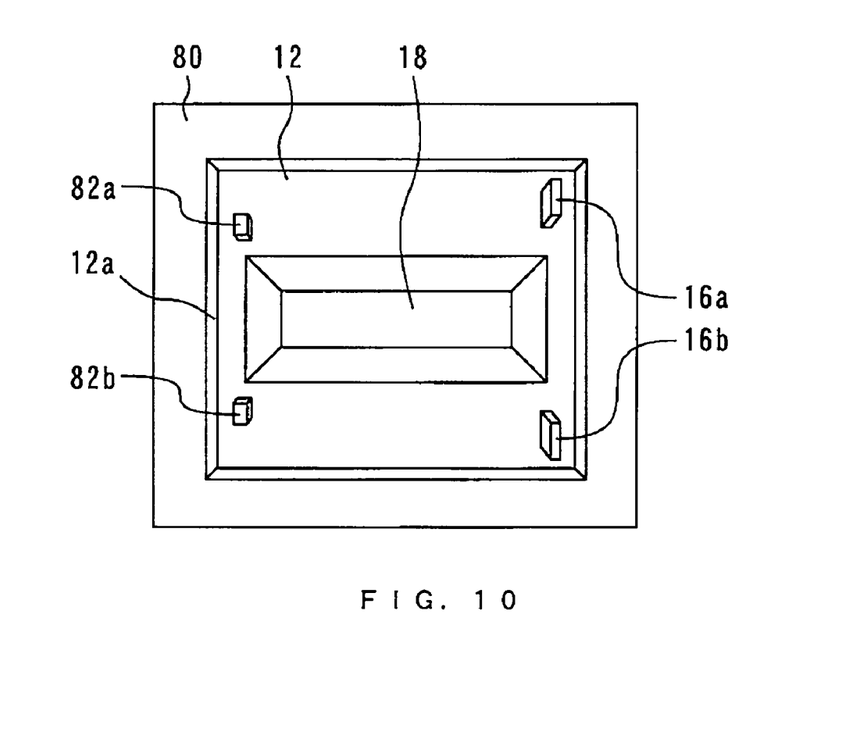
FIG. 10 is a diagram showing an upper die which has another type of projections.

FIG. 10 is a diagram showing an upper die 80 which has projections 82a and 82b instead of the projections 14a and 14b. The projections 82a and 82b are not aligned with the slide projections 16a and 16b as are the projections 14a and 14b in FIG. 1. Thus, the projections 82a and 82b can be formed at any locations, as long as they can be used to form lateral projections on the left and right sides of the gate. Especially when the tie bars are narrow, some projections on the upper die may be formed out of alignment with the slide projections if necessary.

Figure 11:
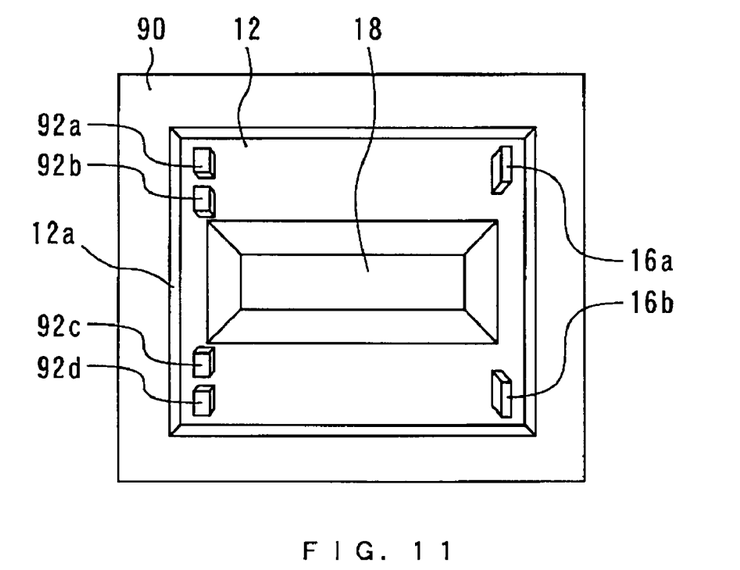
FIG. 11 is a diagram showing the upper die having four projections formed thereon.

Although in the semiconductor device manufacturing method of the first embodiment two projections (in addition to the slide projections) are formed on the upper die, it is to be understood that the present invention is not limited to this arrangement, and three or more projections may be formed on the upper die. An exemplary upper die 90 having four projections formed thereon (in addition to the slide projections) will be described with reference to FIG. 11. FIG. 11 is a diagram showing the upper die 90 having four projections 92a, 92b, 92c, and 92d formed thereon. The use of this upper die 90 enables two lateral projections to be formed on each of the left and right sides of the gate, making it possible to more reliably prevent the molding resin from flowing along the periphery of the lead frame.

Figure 12:
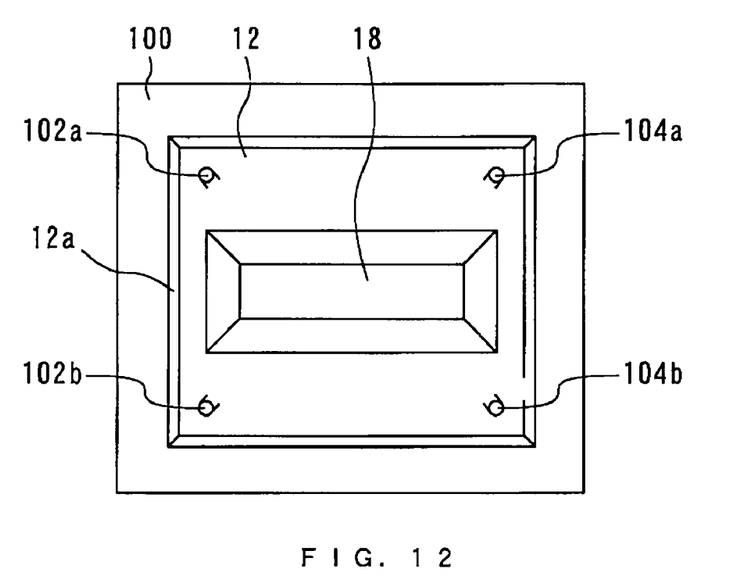
FIG. 12 is a diagram showing the upper die having cylindrical projections and cylindrical slide projections formed thereon.

Although in the semiconductor device manufacturing method of the first embodiment rectangular projections and rectangular slide projections are formed on the upper die, it is to be understood that the present invention is not limited to such projections. An exemplary upper die 100 having cylindrical projections and cylindrical slide projections formed thereon will be described with reference to FIG. 12. FIG. 12 is a diagram showing the upper die 100 having cylindrical projections 102a and 102b and cylindrical slide projections 104a and 104b formed thereon. It is easy to adjust the position and the diameter of cylindrical projections and cylindrical slide projections (sometimes referred to as "pins"), making it possible to reduce die machining time and costs.

Second Embodiment

Figure 13:
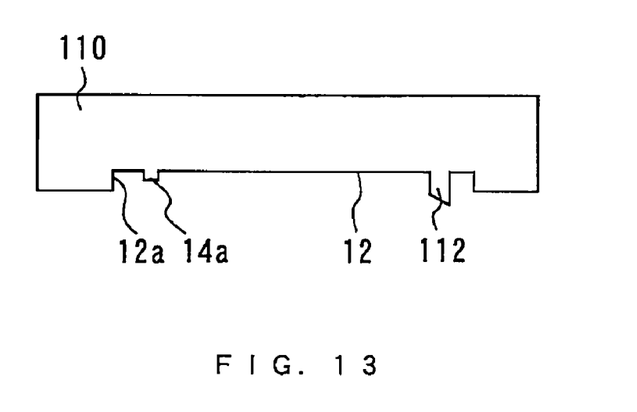
FIG. 13 is a diagram showing an upper die used by a method of manufacturing a semiconductor device in accordance with a second embodiment of the present invention.

FIG. 13 is a diagram showing an upper die 110 used by a method of manufacturing a semiconductor device in accordance with a second embodiment of the present invention. The upper die 110 has a slide projection 112 formed thereon. The leading edge of the slide projection 112 has an inclined surface obliquely facing toward the gate (i.e., toward the injection surface 12a). The semiconductor device manufacturing method of the second embodiment uses this upper die 110 and manufactures a semiconductor device in the same manner as the method of the first embodiment.

In the lead frame sliding step, the inclined surface of the slide projection 112 is brought down to crush the first end portion of the lead frame, as well as to slide the lead frame toward the injection surface 12a. Since the leading edge of the slide projection 112 has this inclined surface, it is possible to smoothly slide the lead frame. The second embodiment also retains the advantages of the first embodiment. Further, the second embodiment is susceptible of alterations which are the same as or correspond to those that can be made to the first embodiment.

Third Embodiment

Figure 14:
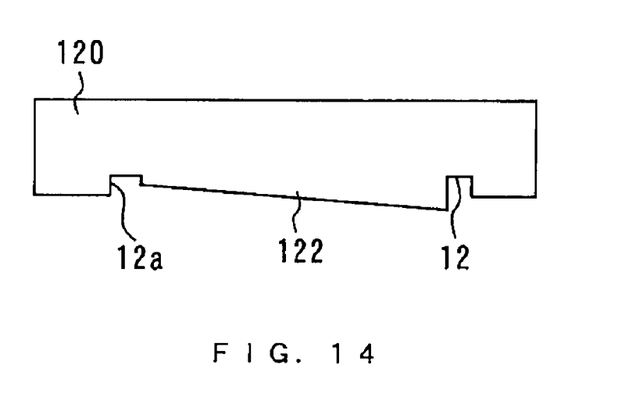
FIG. 14 is a diagram showing an upper die used by a method of manufacturing a semiconductor device in accordance with a third embodiment of the present invention.

FIG. 14 is a diagram showing an upper die 120 used by a method of manufacturing a semiconductor device in accordance with a third embodiment of the present invention. The upper die 120 has an inclined surface 122 formed thereon. This inclined surface 122 has the functions of both the projections and the slide projections of the first embodiment. The semiconductor device manufacturing method of the third embodiment uses this upper die 120 and manufactures a semiconductor device in the same manner as the method of the first embodiment.

In the lead frame sliding step, the inclined surface 122 is brought down to crush the first end portion of the lead frame, as well as to slide the lead frame toward the injection surface. Further, in the lateral projection forming step, the inclined surface 122 is used to crush down the second end portion of the lead frame so as to form a lateral projection. This upper die 120 having the inclined surface 122 is simple in construction, since it does not have projections and slide projections such as those of the first and second embodiments, resulting in reduced machining costs of the upper die. The third embodiment also retains the advantages of the first embodiment. Further, the third embodiment is susceptible of alterations which are the same as or correspond to those that can be made to the first embodiment.

Fourth Embodiment

Figure 15:
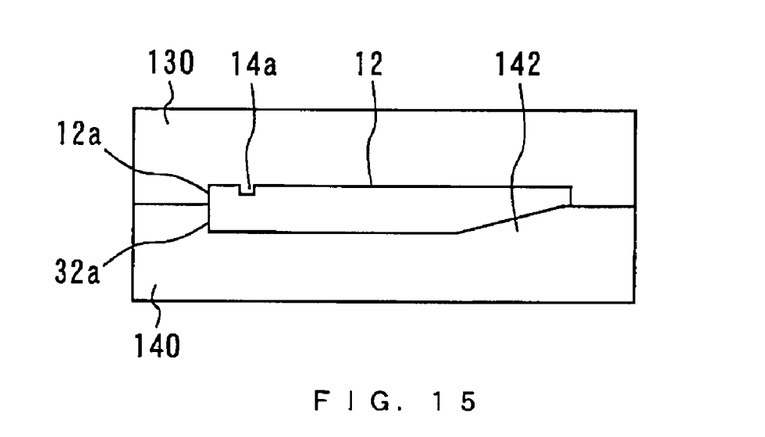
FIG. 15 is a diagram showing an upper die and a lower die used by a method of manufacturing a semiconductor device in accordance with a fourth embodiment of the present invention.

FIG. 15 is a diagram showing an upper die 130 and a lower die 140 used by a method of manufacturing a semiconductor device in accordance with a fourth embodiment of the present invention. A projection 14a is formed on the upper die 130. An inclined surface 142 is formed on the lower die 140 and obliquely faces toward the gate (i.e., toward the injection surfaces 12a and 32a). The semiconductor device manufacturing method of the fourth embodiment uses these upper and lower dies 130 and 140 and manufactures a semiconductor device in the same manner as the method of the first embodiment.

In the lead frame sliding step, the upper die 130 is brought down to push the lead frame mounted in the lower die 140 so that the lead frame slides toward the injection surfaces. Thus, the molding die of the fourth embodiment (including the upper and lower dies 130 and 140) is simpler in construction than that of the first embodiment, since the upper die 130 does not have the slide projections described in connection with the first embodiment and, instead, the inclined surface 142 of the lower die 140 performs the function of slide projections. This results in reduced die machining costs. The fourth embodiment also retains the advantages of the first embodiment. Further, the fourth embodiment is susceptible of alterations which are the same as or correspond to those that can be made to the first embodiment.

In other embodiments, any other suitable sliding means may be provided on the recessed portion of the lower die or upper die in order to slide the lead frame toward the injection surfaces.

Thus the present invention makes it possible to prevent the lead frame from being accidentally pinched between the upper and lower dies, as well as to prevent attachment of the molding resin to the terminals of the lead frame.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2010-226608, filed on Oct. 6, 2010 including specification, claims, drawings and summary, on which the Convention priority of the present application is based, are incorporated herein by reference in its entirety.

What is claimed is:

1. A method of manufacturing a semiconductor device, comprising the steps of:
  mounting a lead frame in a recessed portion of a lower die;
  bringing said lower die and an upper die to overlap each other so that means for sliding said lead frame slides said lead frame toward injection surfaces, one of which is the side surface of said recessed portion of said lower die at which a gate opens and the other of which is the side surface of a recessed portion of said upper die at which said gate opens, said sliding means being formed on said recessed portion of said lower die or on said recessed portion of said upper die;

clamping said lower die and said upper die together so that at least one projection formed on said upper die crushes down an end portion of said lead frame so as to form lateral projections on the left and right sides of said gate, said lateral projections blocking up the gap between said injection surfaces and said lead frame; and injecting a molding resin through said gate.

2. The method according to claim 1, wherein:

said sliding means includes at least one slide projection which is formed on said recessed portion of said upper die and which is longer than said at least one projection; and in said step of bringing said lower die and said upper die to overlap each other, only a portion of the leading edge of said at least one slide projection is brought into contact with the end portion of said lead frame opposite said end portion thereof.

3. The method according to claim 2, wherein said leading edge of said at least one slide projection has formed thereon an inclined surface facing toward said gate.

4. The method according to claim 1, wherein:

said lead frame has a tie bar;

said upper die has a tie bar-crushing projection for crushing down said tie bar; and in said step of clamping said lower die and said upper die together, said tie bar-crushing projection crushes down said tie bar so as to form a lateral projection blocking up the gap between said tie bar and said upper and lower dies.

5. The method according to claim 1, wherein said upper die has more than two said projections formed thereon.

6. The method according to claim 2, wherein said at least one projection and said at least one slide projection are cylindrical in shape.

7. The method according to claim 1, wherein said at least one projection and said sliding means are together constituted by a single inclined surface formed on said upper die and facing toward said gate.

8. The method according to claim 1, wherein said sliding means is an inclined surface formed on said lower die and facing toward said gate.

* * * * *